United States Patent
Steen et al.

(10) Patent No.: US 8,598,025 B2
(45) Date of Patent: Dec. 3, 2013

(54) DOPING OF PLANAR OR THREE-DIMENSIONAL STRUCTURES AT ELEVATED TEMPERATURES

(75) Inventors: Louis Steen, Atkinson, NH (US); Yuri Erokhin, Georgetown, MA (US); Hans-Joachin Ludwig Gossmann, Summit, NJ (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 25 days.

(21) Appl. No.: 13/295,915

(22) Filed: Nov. 14, 2011

(65) Prior Publication Data

US 2012/0135578 A1    May 31, 2012

Related U.S. Application Data

(60) Provisional application No. 61/413,816, filed on Nov. 15, 2010.

(51) Int. Cl.
  *H01L 21/38* (2006.01)
  *H01L 21/02* (2006.01)

(52) U.S. Cl.
  USPC .......................................... 438/558; 257/611

(58) Field of Classification Search
  USPC .......... 438/527–530, 480, 558; 257/611, 917, 257/E21.465–E21.469
  See application file for complete search history.

(56) References Cited

U.S. PATENT DOCUMENTS

| | | | |
|---|---|---|---|
| 3,729,811 A | 5/1973 | Beale et al. | |
| 3,747,203 A | 7/1973 | Shannon | |
| 4,724,300 A | 2/1988 | Dearnaley | |
| 5,196,355 A | 3/1993 | Wittkower | |
| 5,672,541 A | 9/1997 | Booske et al. | |
| 6,096,607 A | 8/2000 | Ueno | |
| 7,217,322 B2* | 5/2007 | Babcock et al. | 117/88 |
| 7,524,743 B2 | 4/2009 | Gupta et al. | |
| 7,723,233 B2* | 5/2010 | Krull et al. | 438/690 |
| 7,968,459 B2 | 6/2011 | Bedell et al. | |
| 8,110,897 B2* | 2/2012 | Noda | 257/607 |
| 2005/0260354 A1 | 11/2005 | Singh et al. | |
| 2006/0263992 A1* | 11/2006 | Chen et al. | 438/301 |
| 2007/0087574 A1 | 4/2007 | Gupta et al. | |
| 2009/0227096 A1 | 9/2009 | Godet et al. | |
| 2011/0171795 A1 | 7/2011 | Tsai et al. | |

FOREIGN PATENT DOCUMENTS

| | | |
|---|---|---|
| GB | 1402996 A | 8/1975 |
| WO | 2010092653 A1 | 8/2010 |

OTHER PUBLICATIONS

Marwick, A.D., et al., Segregation-assisted recoil implantation, Nuclear Instruments and Methods, Apr. 15, 1981, pp. 121-130, vol. 182/183, North-Holland Publishing Company.

* cited by examiner

*Primary Examiner* — Calvin Lee

(57) ABSTRACT

An improved method of doping a workpiece is disclosed. In this method, a film comprising the species to be implanted is introduced to the surface of a planar or three-dimensional workpiece. This film can be grown using CVD, a bath or other means. The workpiece with the film is then subjected to ion bombardment to help drive the dopant into the workpiece. This ion bombardment is performed at elevated temperatures to reduce crystal damage and create a more abrupt doped region.

17 Claims, 4 Drawing Sheets

DOPING OF PLANAR OR THREE-DIMENSIONAL STRUCTURES AT ELEVATED TEMPERATURES

This application claims priority of U.S. Provisional Ser. No. 61/413,816 filed Nov. 15, 2010, the disclosure of which is incorporated herein by reference in its entirety.

FIELD

This invention relates to doping a workpiece and, more particularly, to doping a workpiece using ion bombardment at an elevated temperature.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

The scaling of planar bulk silicon complementary metal oxide semiconductor (CMOS) devices has limitations. For example, at sub-22 nm nodes, the integrated circuit (IC) industry is transitioning to fully depleted (FD) planar or three-dimensional device structures. Doping of these structures using a beam-line ion implanter causes damage to the crystal structure of the silicon, which may not be completely annealed. Active areas in these devices that are damaged or amorphized by ion implantation fail to have the silicon crystal structure restored. This results in degradation of the electrical characteristics in the device. Planar or conformal doping using plasma doping (PLAD) may still introduce some crystal damage. Furthermore, PLAD may produce an oxide or other undesirable films on the workpiece.

Use of a dopant-containing deposited layer also has been attempted. The dopant "drive-in" was performed in a later thermal anneal step. While crystal damage is mostly avoided, a high thermal budget is required and less abrupt dopant profiles are made. This ultimately degrades device performance. Accordingly, there is a need in the art for an improved method of doping, and, more particularly, doping a workpiece using ion bombardment at an elevated temperature.

SUMMARY

An improved method of doping a workpiece is disclosed. In this method, a film comprising the species to be implanted is introduced to the surface of a planar or three-dimensional workpiece. This film can be grown using CVD, ALD, MLD, plasma, plasma assisted deposition, a bath or other means. The workpiece with the film is then subjected to ion bombardment to help drive the dopant into the workpiece. This ion bombardment is performed at elevated temperatures to reduce crystal damage and create a more abrupt doped region.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments of this process are described herein in connection with a plasma doping system. However, these embodiments can be used with other systems and processes involved in semiconductor manufacturing or other systems that use implantation. For example, in an alternate embodiment, a beam-line ion implanter, an ion implanter that modifies a plasma sheath, or flood implanter is used. Thus, the invention is not limited to the specific embodiments described below.

Figure 1:
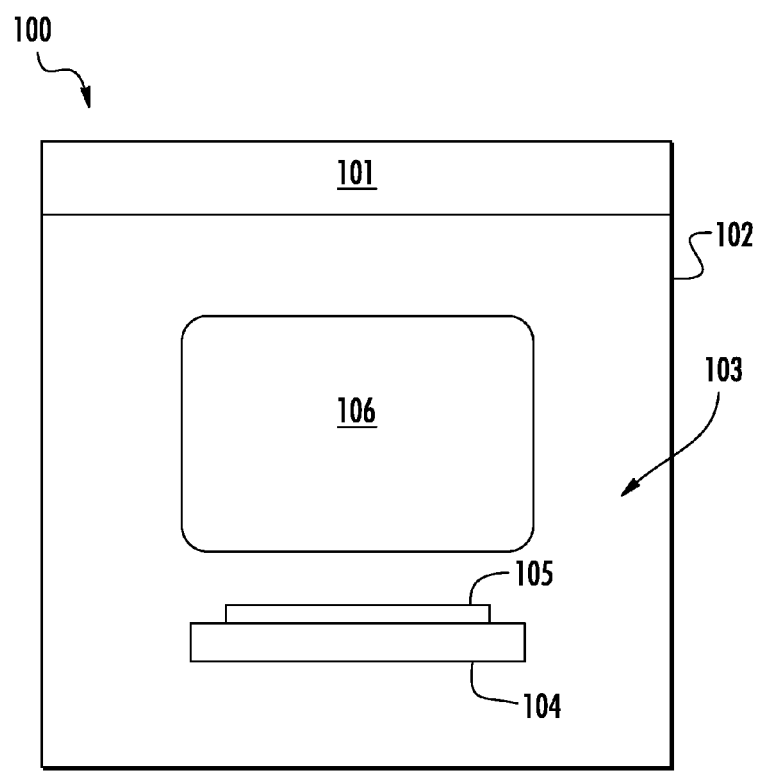
FIG. 1 is a cross-sectional view of a plasma doping system.

Turning to FIG. 1, the plasma doping system 100 includes a process chamber 102 defining an enclosed volume 103. The process chamber 102 or workpiece 105 may be cooled or heated by a temperature regulation system, such as within a load lock or using a pre-chiller. A platen 104 may be positioned in the process chamber 102 to support a workpiece 105. The platen 104 also may be cooled or heated by a temperature regulation system. Thus, the plasma doping system 100 may incorporate hot or cold implantation of ions in some embodiments. In one instance, the workpiece 105 may be a semiconductor wafer having a disk shape, such as, in one embodiment, a 300 mm diameter silicon wafer. However, the workpiece 105 is not limited to a silicon wafer and may be a flat panel, solar cell, or other workpiece. The workpiece 105 may be clamped to a flat surface of the platen 104 by electrostatic or mechanical forces. In one embodiment, the platen 104 may include conductive pins for making connection to the workpiece 105.

The plasma doping system 100 further includes a source 101 configured to generate a plasma 106 from an implant gas within the process chamber 102. The source 101 may be an RF source or other sources known to those skilled in the art. In one instance, an RF source with at least one coil around the process chamber 102 is used. This RF source may be coupled to a matching network and RF generator.

The platen 104 may be biased. This bias may be provided by a DC or RF power supply. The plasma doping system 100 may further include a shield ring, a Faraday sensor, or other components. In some embodiments, the plasma doping system 100 is part of a cluster tool, or operatively-linked process chambers 102 within a single plasma doping system 100. Thus, numerous process chambers 102 may be linked in vacuum.

During operation, the source 101 is configured to generate the plasma 106 within the process chamber 102. In one embodiment, the source 101 is an RF source that resonates RF currents in at least one RF antenna to produce an oscillating magnetic field. The oscillating magnetic field induces RF currents in the process chamber 102. The RF currents in the process chamber 102 excite and ionize the implant gas to generate the plasma 106. The bias provided to the platen 104 and, hence, the workpiece 105 will accelerate ions from the plasma 106 toward the workpiece 105 during bias pulse on periods. The frequency of the pulsed platen signal and/or the duty cycle of the pulses may be selected to provide a desired dose rate. The amplitude of the pulsed platen signal may be selected to provide a desired energy. With all other parameters being equal, a greater energy will result in a greater implanted depth.

Figure 2:
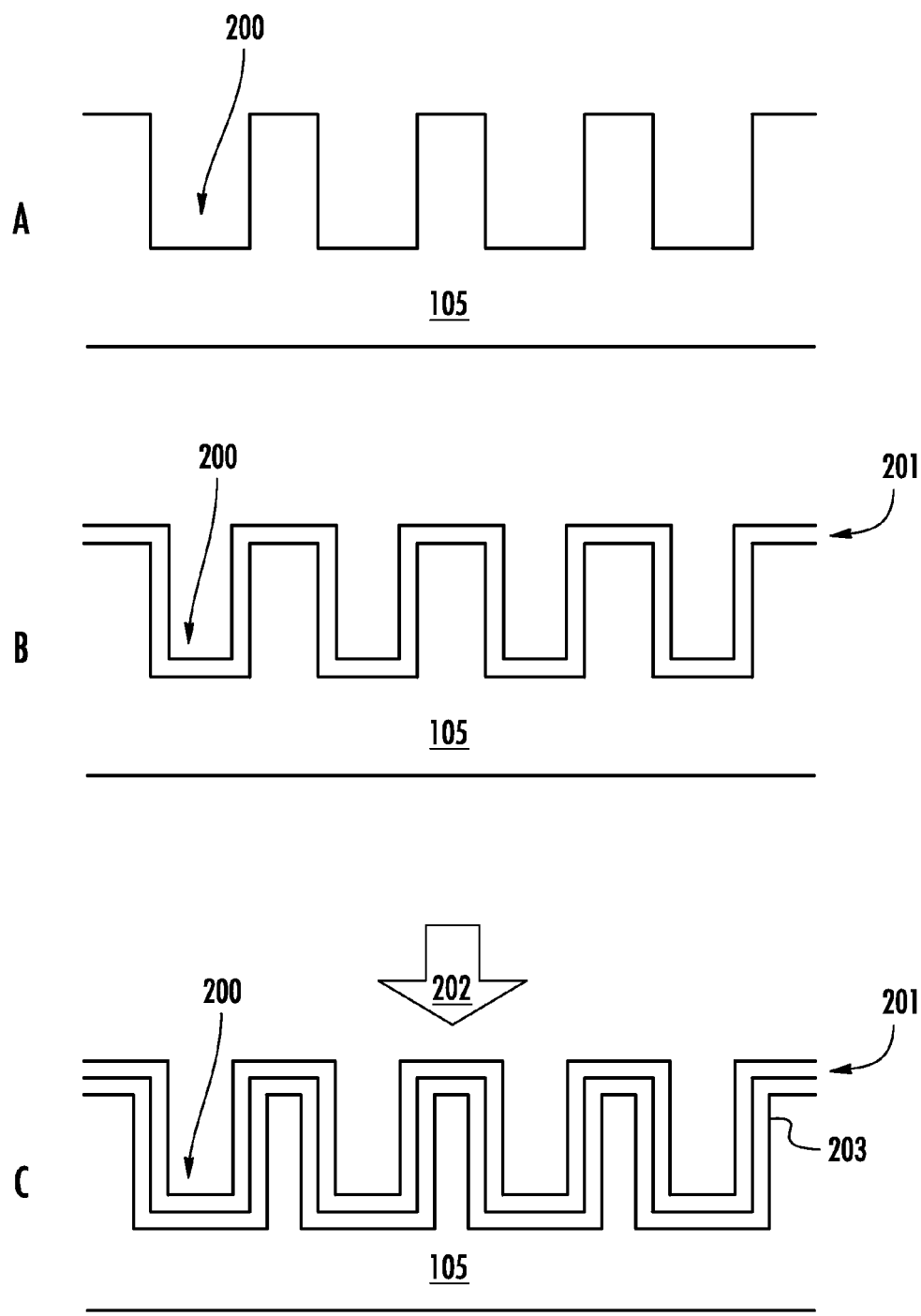
FIGS. 2A-C are cross-sectional side views of one embodiment of the process disclosed herein.

FIGS. 2A-C are cross-sectional side views of one embodiment of the process disclosed herein. In FIG. 2A, the workpiece 105 is illustrated. The workpiece 105 has a plurality of trenches 200. While this particular embodiment of the workpiece 105 is illustrated, other workpieces with different three-dimensional structures are possible. For example, a FinFET or other vertical device also may be used. Furthermore, while a three-dimensional surface is illustrated in FIG. 2A, a planar surface or a selected portion of a workpiece also may be doped using the embodiments disclosed herein. For instance, if selective deposition or selective doping is used, only part of a workpiece may be processed in this manner. Thus, the embodiments disclosed herein may be applied to numerous different workpiece types and shapes known to those skilled in the art.

In FIG. 2B, a film 201 is deposited on the workpiece 105. This film may be applied using chemical vapor deposition (CVD), may be applied using a bath, or may be deposited in a PLAD system such as that illustrated in FIG. 1. Of course, the film 201 may be applied using other methods known to those skilled in the art, such as atomic layer deposition (ALD) or molecular layer deposition (MLD). In some embodiments, the thickness of the film is such that it is thick enough to provide adequate numbers of dopant atoms that will be later driven into the workpiece. The film must also be thin enough to not fill the trenches 200 between the 3 dimensional structures. In some embodiments, the film is less than ten monolayers thick, although other thicknesses may be used, based on the geometry of the workpiece, such as the depth and width of the trenches 200.

In one particular embodiment, a plasma tool that modifies a plasma sheath is used for selective deposition. In other embodiments, other mechanisms may be used to allow for selective deposition. For example, a photoresist or hard mask may be used over portions of the workpiece to prevent the formation of film on that portion of the workpiece.

The film 201 covers a surface of the trenches 200 in the workpiece 105. This film 201 may contain any n-type or p-type dopant, such as but not limited to boron, arsenic, or phosphorus.

In FIG. 2C, ions 202 bombard the workpiece 105 and the film 201. In one instance the bombardment ions 202 are argon, though other noble gases, other inert species, or other species may be used. For example, non-doping species such as silicon, germanium, neon, or carbon may also be used. In another instance, a dopant is used for the bombardment ions 202, which may at least partially dope the workpiece 105. The implant energy used may vary, depending on the mass of the bombardment ions, the mass of the dopant ions, the angle of implant, and other parameters. For example, an implant energy of between 1 and 20 keV may be used for lighter bombardment ions, such as silicon, carbon and neon, while an implant energy of between 3 and 30 keV may be used for heavier bombardment ions, such as argon and germanium.

Figure 3:
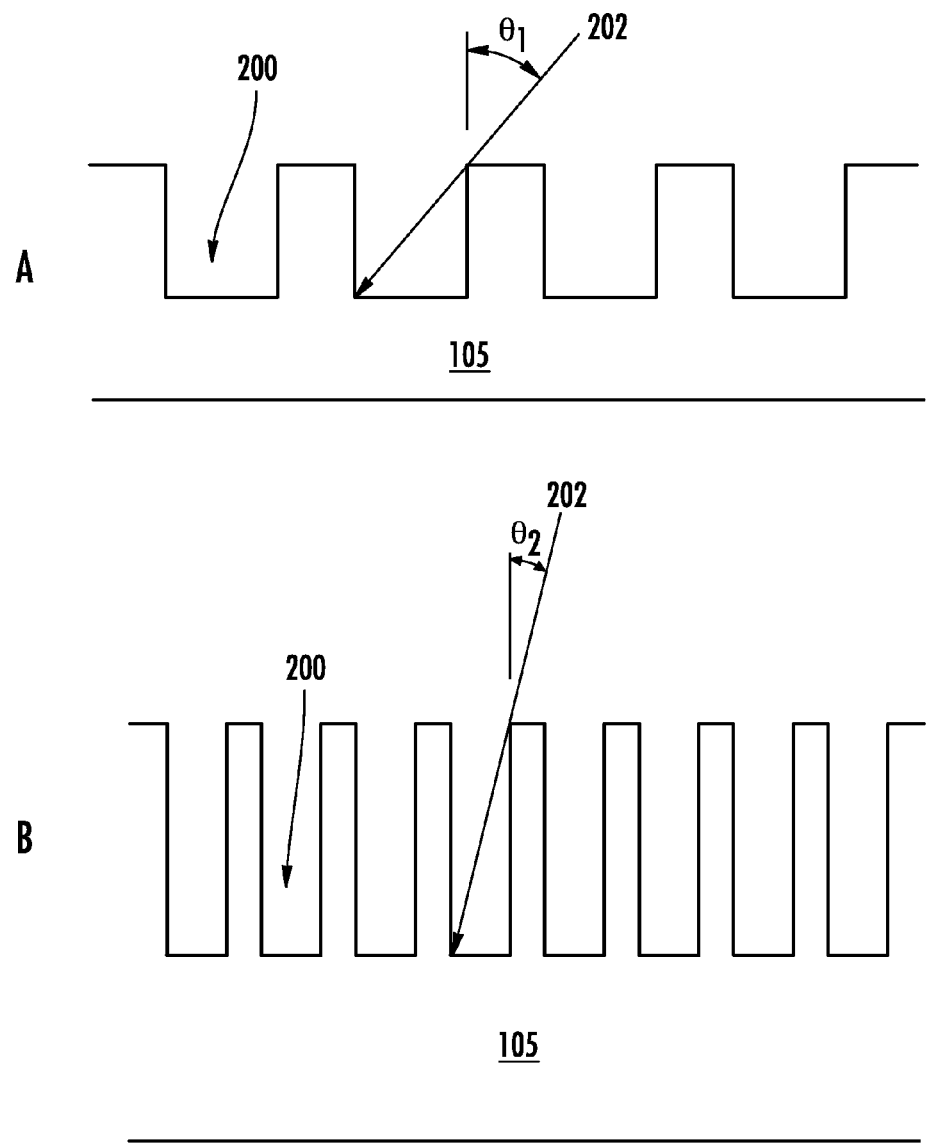
FIGS. 3A-B show different implant angles.

The implant angle is determined, at least in part, by the ratio of the width of a trench 200 to its depth. For example, as seen in FIG. 3A, if the ratio of trench width to depth is high (indicating a shallow, wide trench), the maximum implant angle $\theta_1$ may be greater than the maximum implant angle $\theta_2$ where the ratio of the trench wide to its depth is low (indicating that it is a deep, narrow trench), as shown in FIG. 3B. Greater implant angle may require lower implant energies than smaller implant angles. In this example, implant angle is defined as the deviation from the normal, or perpendicular direction, relative to the plane of the workpiece 105.

Returning to FIG. 2C, the workpiece 105 is kept at an elevated temperature during this bombardment using the bombardment ions 202. This heating may use lamps, pre-heating, or heating of a platen 104 that the workpiece 105 is disposed on. The bombardment ions 202 knock-in dopants from the film 201 to form a doped region 203. This doped region 203 is formed on all surfaces of the workpiece 105, including in or around the trenches 200. Although the bombardment ions 202 are shown as being implanted perpendicular to the plane of the workpiece 105, the disclosure is not limited to this embodiment. As shown in FIGS. 3A-B, the bombardment ions 202 may be implanted at an angle, where that angle may be determined based on the geometry of the trenches 200.

The temperature is configured to prevent formation of amorphous layers in the doped region 203 and to initiate "radiation enhanced diffusion." The temperature may be between 150° C. and 800° C. depending on the dopant in the film 201, ion bombardment conditions, and geometry of the surface of the workpiece 105. In other embodiments, the temperature may be between 400° C. and 600° C. The temperature and ion bombardment conditions may be tuned independently to optimize the workpiece 105.

Figure 4:
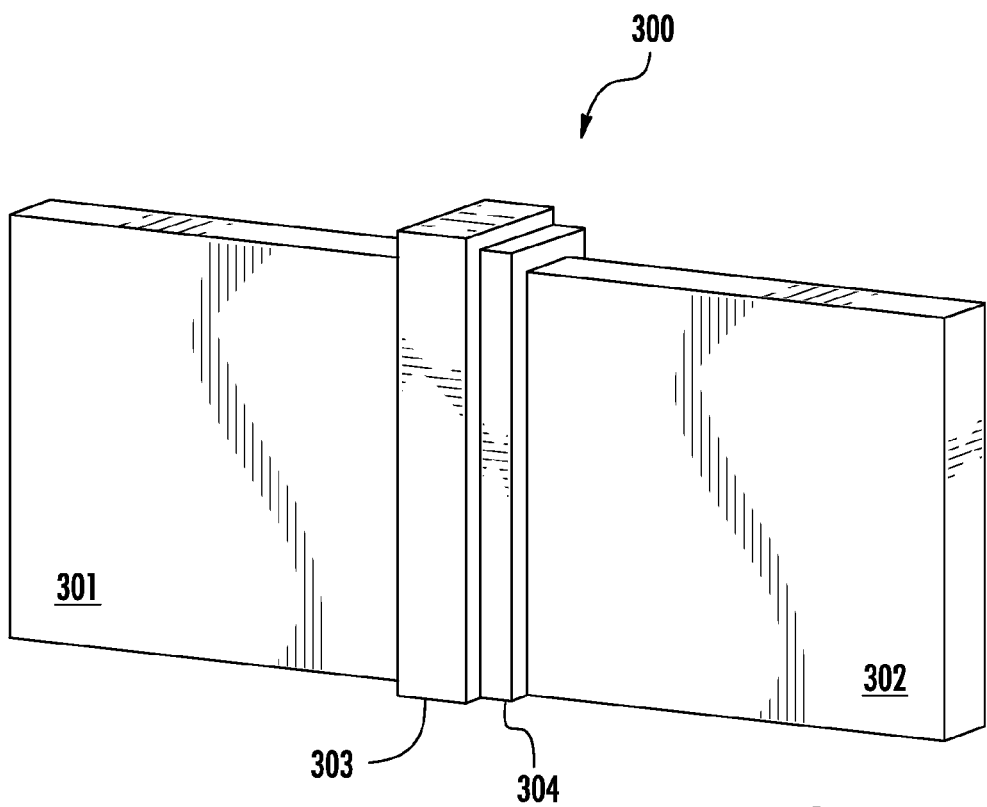
FIG. 4 shows a representative FinFET that may be created using the process disclosed herein.

For example, a FinFET 300, is shown in FIG. 4. The FinFET 300 includes a drain 301 and source 302, which are three dimensional structures, also described as fins. A gate 303 is wrapped over the fin so as to create contacts on three sides of the fin. Spacers 304 are typically located on either side of the gate 303 (although only one is shown in FIG. 4). It may be desirable to dope the drain 301 and source 302.

To achieve this, a hard mask, such as silicon dioxide or silicon nitride, may be placed on the gate 303 and spacers 304. A film containing the desired dopant, as described in conjunction with FIG. 2B, is then applied to the surface of the workpiece, so as to cover the drain 301 and the source 302. The photoresist inhibits the formation of film on the gate 303 and spacer 304. After the film has been deposited, the temperature of the workpiece is elevated, and bombardment ions 202 are introduced to knock in the dopant into the workpiece. The use of the combination of elevated temperature and bombardment has several benefits. First, typical thermal diffusion creates a doped region which does not have an abrupt junction. By knocking the dopant into the workpiece, the junction that is produced can be much more abrupt. Further, the use of bombardment also lowers the thermal budget associated with diffusion.

It may also be desirable to introduce doped regions beneath the spacers 304. By varying the temperature during the bombardment, it is possible to create desired diffusion patterns beneath the spacers 304. These regions may not be created without the combination of bombardment and an elevated temperature, as it is the elevated temperature that allows the dopant to diffuse under the spacer 304. Furthermore, the use of bombardment allows these regions to have more abrupt junctions than would be possible with only thermal diffusion.

The ion 202 bombardment in one instance is performed in a separate chamber from deposition of the film 201. In another embodiment, the ion 202 bombardment and film 201 deposition occur in the same chamber, such as in a PLAD system as illustrated in FIG. 1. If the same chamber is used, then the two steps may occur without breaking vacuum.

A supplemental rapid thermal anneal (sRTA), a millisecond anneal (MSA), or a "multi-pass" laser anneal may be eliminated by use of the elevated temperature during bombardment of the ions 202. This may reduce the complexity and cost associated with the annealing step. However, an anneal may still be performed after the step illustrated in FIG. 2C. For example, a laser anneal may be used to achieve a high concentration of electrically-active dopant.

The elevated temperature used during the ion bombardment provides multiple benefits besides improved device performance. First, it provides a dynamic anneal of defects introduced into the workpiece 105 due to the ions 202. Amorphous layers in the workpiece 105 or doped region 203 may be reduced or prevented. Second, it reduces sensitivity of dopant diffusion. Third, it lowers the temperature required for diffusion of the dopants in the film 201 due to diffusion enhancement by point defects introduced during the knock-in process. Thus, desired diffusion depth may be achieved at a lower processing temperature by using "radiation enhanced diffusion." This minimized thermal budget may be used for the post-implant anneal between the source drain extension (SDE) and the gate in a transistor structure. This may enable high-k metal gate (MG) stacks for MG first formation schemes and other temperature-sensitive elements of a transistor architecture. Fourth, more abrupt dopant profiles may be created compared to using a pure thermal drive-in process. The ion bombardment enables a more abrupt profile as a diffusion length component related to a thermal diffusion is reduced.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, any claims should be construed in view of the full breadth and spirit of the present disclosure as described herein.

What is claimed is:

1. A method of implanting a dopant of a first species into a workpiece, comprising:
   depositing a film on a surface of said workpiece, said film comprising said dopant; and
   bombarding said workpiece with ions of a second species such that said dopant from said film is driven into said workpiece by said ions of said second species, wherein said ion bombardment is performed at an elevated temperature.

2. The method of claim 1, wherein said second species is selected from the group consisting of argon, silicon, carbon, germanium, and neon.

3. The method of claim 1, wherein said second species comprises said first species.

4. The method of claim 1, wherein said elevated temperature is between 150° C. and 800° C.

5. The method of claim 4, wherein said elevated temperature is between 400° C. and 600° C.

6. The method of claim 1, wherein said depositing and said bombarding are performed at least partially simultaneously.

7. The method of claim 1, wherein said depositing step is performed using chemical vapor deposition, atomic layer deposition, molecular layer deposition, or plasma assisted deposition.

8. The method of claim 1, further comprising performing an anneal following said bombarding step.

9. The method of claim 1, wherein said film is deposited on a portion of said workpiece, such that only said portion is implanted with said dopant.

10. The method of claim 1, wherein said ions are directed toward said workpiece at an implant angle, wherein said implant angle is different than perpendicular to said surface of said workpiece.

11. A method of introducing a desired dopant into a source region and a drain region of a FinFET, comprising:
    forming a three dimensional structure in a workpiece;
    forming a gate region which covers a part of said three dimensional structure, thereby creating two exposed portions of said three dimensional structure, where a first exposed portion, adapted to form said source region, is on one side of said gate region and a second exposed portion, adapted to form said drain region, is on an opposite side of said gate region;
    covering said gate region with a hard mask;
    depositing a film on said first exposed portion and said second exposed portion, said film comprising said desired dopant; and
    bombarding said workpiece with ions of a second species, such that said dopant from said film is driven into said first exposed region and said second exposed region by said ions of said second species, wherein said bombarding occurs at an elevated temperature.

12. The method of claim 11, wherein
    said elevated temperature is between 150° C. and 800° C.

13. The method of claim 12, wherein said elevated temperature is between 400° C. and 600° C.

14. The method of claim 11, wherein said film is deposited using chemical vapor deposition, atomic layer deposition, molecular layer deposition, or plasma assisted deposition.

15. The method of claim 11, wherein said second species is selected from the group consisting of argon, silicon, carbon, germanium and neon.

16. The method of claim 11, wherein said ions are directed toward said workpiece at an angle, wherein said angle is different than perpendicular to a surface of said workpiece.

17. The method of claim 11, further comprising forming spacer regions on either side of said gate region, and wherein said dopant diffuses beneath said spacer regions.

* * * * *